United States Patent [19]

Unozawa

[11] Patent Number: 5,304,507
[45] Date of Patent: Apr. 19, 1994

[54] PROCESS FOR MANUFACTURING SEMICONDUCTOR LASER HAVING LOW OSCILLATION THRESHOLD CURRENT

[75] Inventor: Kousei Unozawa, Tokyo, Japan

[73] Assignee: NEC Corporation, Tokyo, Japan

[21] Appl. No.: 4,304

[22] Filed: Jan. 14, 1993

[30] Foreign Application Priority Data

Jan. 14, 1992 [JP] Japan .................................. 4-4388

[51] Int. Cl.[5] .................................................. H01L 21/205
[52] U.S. Cl. .................................. 437/129; 148/DIG. 95
[58] Field of Search ................ 437/129, 127, 905; 148/DIG. 95

[56] References Cited

U.S. PATENT DOCUMENTS

| | | | |
|---|---|---|---|
| 5,023,880 | 6/1991 | Suzuki et al. | 372/45 |
| 5,029,175 | 7/1991 | Ohnaka et al. | 372/46 |
| 5,143,863 | 9/1992 | Ohnaka et al. | 437/129 |
| 5,173,447 | 12/1992 | Ijichi et al. | 437/127 |
| 5,177,757 | 1/1993 | Tsugami | 372/45 |
| 5,189,680 | 2/1993 | Kimura | 372/46 |

FOREIGN PATENT DOCUMENTS

| | | | |
|---|---|---|---|
| 62-200785 | 9/1987 | Japan . | |
| 100788 | 5/1988 | Japan | 437/129 |
| 254715 | 10/1990 | Japan | 437/129 |

OTHER PUBLICATIONS

H. Hamada, et al "AlGaInP Visible Laser Diodes Grown on Misoriented Substrates" IEEE Journal of Quantum Electronics vol. 27, No. 6, Jun. 1991 pp. 1483-1490.

Article No. 27p-R-12 in 1990 Autumn Meeting Transactions of the Japan Society of Applied Physics, p. 941.

*Primary Examiner*—Brian E. Hearn
*Assistant Examiner*—Linda J. Fleck
*Attorney, Agent, or Firm*—Sughrue, Mion, Zinn, Macpeak & Seas

[57] ABSTRACT

In a first crystal growth process for manufacturing a semiconductor laser, an n-$(Al_yGa_{1-y})_{0.5}In_{0.5}P$ clad layer, an undoped $(Al_zGa_{1-z})_{0.5}In_{0.5}P$ active layer, a p-$(Al_yGa_{1-y})_{0.5}In_{0.5}P$ clad layer, a p-$Ga_{0.5}In_{0.5}P$ layer, and an n-type semiconductor layer, are sequentially stacked in the named order on an upper surface of a GaAs substrate. Thereafter, the n-type semiconductor layer is removed, and the p-$Ga_{0.5}In_{0.5}P$ layer and the p-$(Al_yGa_{1-y})_{0.5}In_{0.5}P$ clad layer are selectively removed so as to form a ridge stripe. A current block layer is formed on the p-$(Al_yGa_{1-y})_{0.5}In_{0.5}P$ clad layer at both sides of the ridge stripe, and a p-GaAs contact layer is formed on the ridge stripe and the current block layer. With this process, since the n-type semiconductor layer is formed to cover the p-$Ga_{0.5}In_{0.5}P$ layer in the first crystal growth process, the saturated concentration of the doping characteristics of the p-$Ga_{0.5}In_{0.5}P$ layer becomes high, and accordingly, confinement of injected carriers within the active layer in the doubleheterojunction structure is improved, so that an electron overflow from the active layer is reduced, and therefore, the oscillation threshold current becomes low.

12 Claims, 3 Drawing Sheets

PROCESS FOR MANUFACTURING SEMICONDUCTOR LASER HAVING LOW OSCILLATION THRESHOLD CURRENT

BACKGROUND OF THE INVENTION

1. Field of the invention

The present invention relates to a semiconductor laser which can be used as a light source in a laser printer, a bar code reader and the like, and more specifically to a process for manufacturing a semiconductor laser generating a visible light having an oscillation wavelength of 680 nm or less.

2. Description of Related Art

Article No. 27p-R-12 in 1990 Autumn Meeting Transactions of the Japan Society of Applied Physics, page 927 discloses a semiconductor laser as shown in FIG. 1, and a method for manufacturing the same. This semiconductor laser includes a GaAs substrate 1 having an upper surface inclined at an angle of 5 degrees from a (1 0 0) plane toward a <0 1 1> direction (namely, (100) 5° off to <0 1 1>). In a first crystal growth process of a MO-VPE (metal organic vapor phase epitaxy) process, a doubleheterojunction structure composed of a $(Al_{0.1}Ga_{0.9})_{0.5}In_{0.5}P$ active layer 4 (forming a light emission region) sandwiched between an n-type and p-type $(Al_yGa_{1-y})_{0.5}In_{0.5}P$ clad layers 3 and 5 having a forbidden band width larger than that of the active layer, is formed on the upper surface of the substrate, and furthermore, a p-type $Ga_{0.5}In_{0.5}P$ layer 6 is grown on the p-type clad layer 5.

Thereafter, an oxide film (not shown) is deposited, and then patterned by a photoresist process so as to an oxide stripe which forms an etching mask for formation of a ridge stripe and a selective growth. And, the p-type clad layer 5 is etched to a middle in the thickness direction.

Then, a second crystal growth is performed so that a current block layer 10 is selectively grown using the remaining oxide stripe as a mask. Thereafter, the oxide film is removed, and a p-type GaAs contact layer 11 is grown on a whole surface. Finally, a pair of electrodes 12 and 13 are deposited on top and bottom surfaces of the substrate. Thus, the semiconductor laser is formed.

The conventional semiconductor laser as mentioned above has an oscillation light wavelength of 645 nm and an oscillation threshold of 80 mA to 90 mA. Another conventional semiconductor laser is disclosed in Japanese Patent Application Laid-open Publication No. Sho 62-200785.

In the above mentioned conventional process for manufacturing the semiconductor laser, the first crystal growth is terminated at the formation of the p-type $Ga_{0.5}In_{0.5}P$ layer 6. Because of this, a doping characteristics of the p-type clad layer 5 becomes as a curve line "b" shown in FIG. 2. Namely, a saturated carrier concentration is as low as $3 \times 10^{17} cm^{-3}$. Therefore, confinement of injected carriers within the active layer 4 in the doubleheterojunction structure becomes insufficient, so that an electron overflow becomes much, and therefore, the oscillation threshold becomes as high as 80 mA to 90 mA.

SUMMARY OF THE INVENTION

Accordingly, it is an object of the present invention to provide a process for manufacturing a semiconductor laser, which has overcome the above mentioned defect of the conventional one.

Another object of the present invention is to provide a process for manufacturing a semiconductor laser, which can increase the carrier concentration of a clad layer, so that the semiconductor laser manufactured can have a reduced oscillation threshold current.

The above and other objects of the present invention are achieved in accordance with the present invention by a process for manufacturing a semiconductor laser, comprising the steps of sequentially stacking a first clad layer of a compound semiconductor of a first conductivity type, an active layer of an undoped compound semiconductor, a second clad layer of a compound semiconductor of a second conductivity type, a first contact layer of a compound semiconductor of the second conductivity type, and a barrier layer of a compound semiconductor of the first conductivity type, in the named order on an upper surface of a compound semiconductor substrate, removing the barrier layer, selectively removing the first contact layer and the second clad layer so that a ridge stripe is formed of the remaining first contact layer and the remaining second clad layer, and the second clad layer having a reduced thickness remains at both sides of the ridge stripe, forming a current block layer on the second clad layer at both sides of the ridge stripe, and forming a second contact layer of a compound semiconductor of the second conductivity type on the ridge stripe and the current block layer.

In a preferred embodiment, the process in accordance with the present invention for manufacturing a semiconductor laser, comprises the steps of sequentially stacking a first conductivity type of $(Al_yGa_{1-y})_{0.5}In_{0.5}P$ clad layer ($0.5 \geq y < 1$), an undoped $(Al_zGa_{1-z})_{0.5}In_{0.5}P$ active layer forming a light emission region ($0 \geq z \geq 0.3$), a second conductivity type of $(Al_yGa_{1-y})_{0.5}In_{0.5}P$ clad layer ($0.5 < y < 1$), a second conductivity type of $Ga_{0.5}In_{0.5}P$ layer, and a first conductivity type of semiconductor layer, in the named order on an upper surface of a GaAs substrate, the upper surface being inclined at an angle of X degrees from a (1 0 0) plane toward a (0 1 1) plane ($O < X < 16$), removing the first conductivity type of semiconductor layer, selectively removing the second conductivity type of $Ga_{0.5}In_{0.5}P$ layer and the second conductivity type of $(Al_yGa_{1-y})_{0.5}In_{0.5}P$ clad layer so that a ridge stripe extending in a [0−1 1] direction is formed of the remaining second conductivity type of $Ga_{0.5}In_{0.5}P$ layer and the remaining second conductivity type of $(Al_yGa_{1-y})_{0.5}In_{0.5}P$ clad layer, and the second conductivity type of $(Al_yGa_{1-y})_{0.5}In_{0.5}P$ clad layer having a reduced thickness remains at both sides of the ridge stripe, forming a current block layer on the second conductivity type of $(Al_yGa_{1-y})_{0.5}In_{0.5}P$ clad layer at both sides of the ridge stripe, and forming a second conductivity type of GaAs contact layer on the ridge stripe and the current block layer.

As will be apparent from the above, the process in accordance with the present invention is characterized in that the first crystal growth process is not terminated at formation of the second conductivity type of $Ga_{0.5}In_{0.5}P$ layer, but is continued until the first conductivity type of semiconductor layer is formed. Since the first conductivity type of semiconductor layer is formed to cover the second conductivity type of $Ga_{0.5}In_{0.5}P$ layer in the first crystal growth process, the doping characteristics of the second conductivity type of $Ga_{0.5}In_{0.5}P$ layer is improved as shown by the curved line "a" in FIG. 2. Namely, since the saturated concentration of the doping characteristics becomes high, confinement of injected carriers within the active layer in the doubleheterojunction structure is improved in the semiconductor laser manufactured, so that an electron overflow from the active layer is reduced, and therefore, the oscillation threshold current becomes low.

The above and other objects, features and advantages of the present invention will be apparent from the following description of preferred embodiments of the invention with reference to the accompanying drawings.

DESCRIPTION OF THE PREFERRED EMBODIMENTS

Referring to FIG. 3A to 3E, there are shown diagrammatic sectional views illustrating one embodiment of the process in accordance with the present invention for manufacturing a semiconductor laser.

Figure 3A:
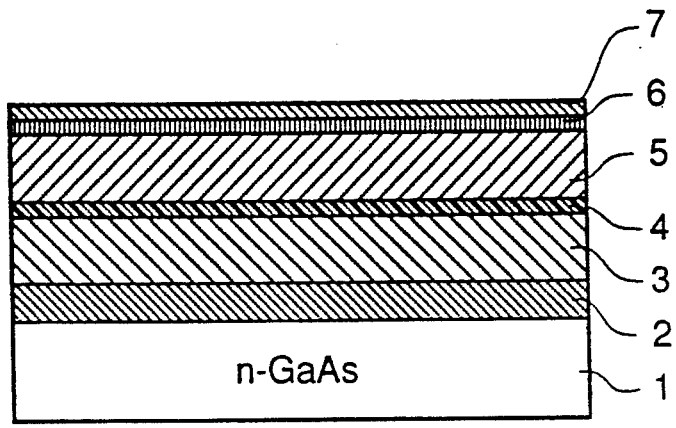
FIGS. 3A to 3E are diagrammatic sectional views illustrating one embodiment of the process in accordance with the present invention for manufacturing a semiconductor laser.

A first crystal growth process is performed on an n-GaAs substrate 1 by a MO-VPE (metal organic vapor phase epitaxy) process at a growth temperature of 660° C. under a growth pressure of 75 Torr, so as to form a multilayer structure as shown in FIG. 3A. Specifically, the substrate I has an upper surface inclined at an angle of 5 degrees from a (1 0 0) plane toward a (0 1 1) plane. On this (1 0 0) GaAs substrate 1 with a misorientation of 5 degrees toward the (0 1 1) direction, there are sequentially deposited or grown in the name order in the first continuous crystal growth process, an Si-doped n-GaAs buffer layer 2 having a thickness of 0.5 $\mu$m and a carrier concentration of $1 \times 10^{18} cm^{-3}$, an Si-doped n-(Al$_{0.6}$Ga$_{0.4}$)$_{0.5}$In$_{0.5}$P clad layer 3 having a thickness of 1 $\mu$m and a carrier concentration of $5 \times 10^{17} cm^{-3}$, an undoped (Al$_{0.1}$Ga$_{0.9}$)$_{0.5}$In$_{0.5}$P active layer 4 having a thickness of 0.06 $\mu$m, a Zn-doped p-(Al$_{0.6}$Ga$_{0.4}$)$_{0.5}$In$_{0.5}$P clad layer 5 having a thickness of 1 $\mu$m and a carrier concentration of $4 \times 10^{17} cm^{-3}$, Zn-doped p-Ga$_{0.5}$In0.5P layer 6 having a thickness of 0.1 $\mu$m and a carrier concentration of $1 \times 10^{18} cm^{-3}$, and an Si-doped n-GaAs layer 7 having a thickness of 0.2 $\mu$m and a carrier concentration of $5 \times 10^{17} m^{-3}$.

Figure 3B:
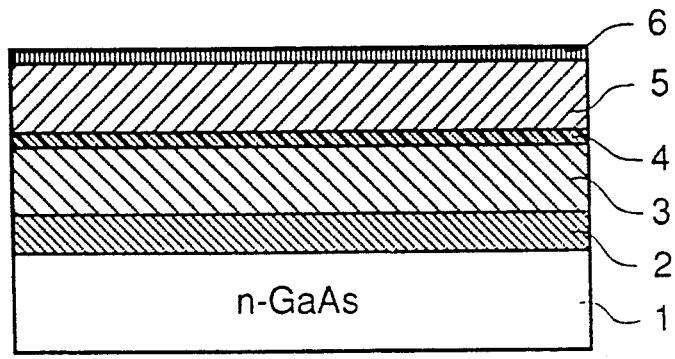

Thereafter, as shown in FIG. 3B, the n-GaAs layer 7 is completely removed by using a phosphoric acid type etching liquid, so that the p-Ga$_{0.5}$In$_{0.5}$P layer 6 is exposed.

Figure 3C:
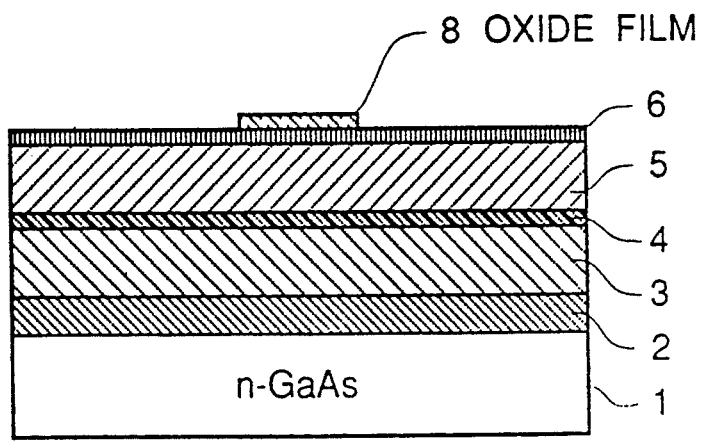

Then, an oxide film of SiO$_2$ having a thickness of 0.2 $\mu$m is deposited, and the deposited oxide film is patterned by a photoresist process so as to form ail oxide film stripe 8 of SiO$_2$ extending in a [0−1 1] direction, as shown in FIG. 3C. This oxide film stripe 8 forms an etching mask for formation of a ridge stripe and a mask for selective growth.

Figure 3D:
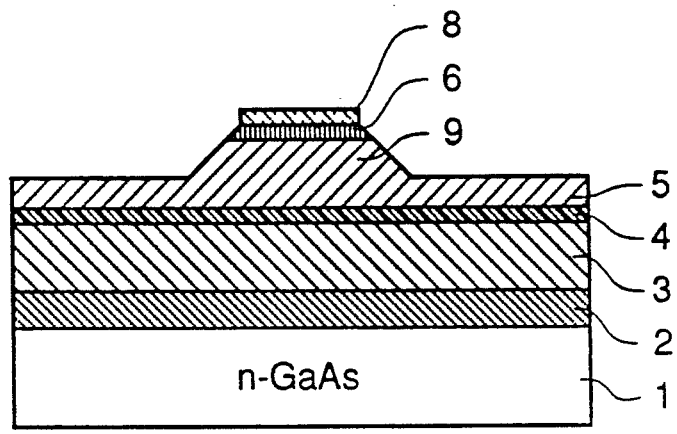

By using the oxide film stripe 8 Of SiO$_2$ as a mask, the p-Ga$_{0.5}$In$_{0.5}$P layer 6 and the p-type clad layer 5 are etched by a sulfuric acid type etching liquid until a ridge stripe 9 having a ridge width of 5 $\mu$tm is formed as shown in FIG. 3D and the p-type clad layer 5 is thinned to have the remaining thickness of 0.2 $\mu$m at both sides of the ridge stripe 9.

Thereafter, a second crystal growth process is performed by a MO-VPE process at a growth temperature of 650° C. under a normal pressure, so that an Si-doped n-GaAs current block layer 10 having a thickness of 0.8 $\mu$m and a carrier concentration of $3 \times 10^{18} cm^{-3}$, is selectively grown at both sides of the ridge stripe 9 using the oxide film stripe 8 Of SiO$_2$ as a mask.

Figure 3E:
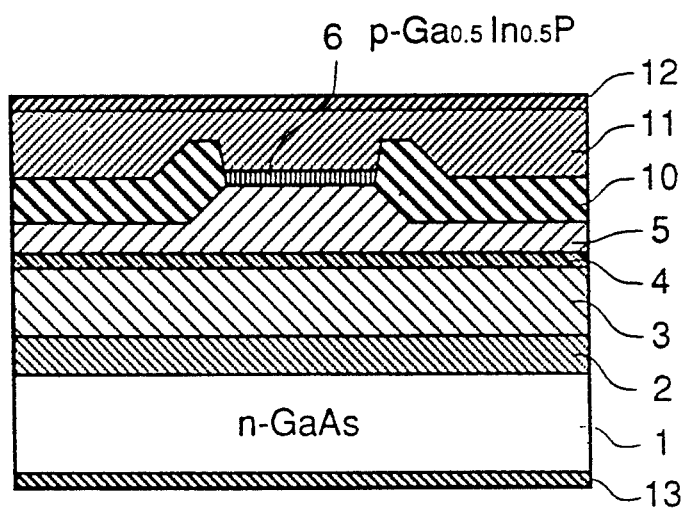

Then, the oxide film stripe 8 Of SiO$_2$ is removed, and a third crystal growth process is performed by a MO-VPE process at a growth temperature of 650° C. under a normal pressure, so that an Zn-doped p-GaAs contact layer 11 having a thickness of 3 $\mu$m and a carrier concentration of $2 \times 10^9 cm^{-3}$ is grown to cover a whole surface of the current block layer 10 and the p-Ga$_{0.5}$In$_{0.5}$P layer 6. Thereafter, electrodes 12 and 13 are formed on the contact layer 11 and a bottom surface of the substrate 1, respectively. Thus, the semiconductor laser having a sectional structure as shown in FIG. 3E is completed.

A semiconductor laser having a cavity length of 400 $\mu$m was manufactured in accordance with the above mentioned process. The semiconductor laser manufactured had an oscillation wavelength of 650 nm and an oscillation threshold current of 50 mA, and also had an oscillation characteristics having no kink until a light output power reaches 5 mW.

In the above mentioned semiconductor laser, the active layer 4 can be formed of a multiple quantum well structure. In addition, the current block layer 10 can be formed a semiconductor crystal having a bandgap larger than the oscillation wavelength, in place of GaAs, so that an effective refractive index waveguide structure is constituted.

In the above mentioned embodiment, the Si-doped n-(Al$_{0.6}$Ga$_{0.4}$)$_{0.5}$In$_{0.5}$P clad layer 3 and the Zn-doped p-(Al$_{0.6}$Ga$_{0.4}$)$_{0.5}$In$_{0.5}$P clad layer 5 can be expressed as an n-(Al$_y$Ga$_{1-y}$)$_{0.5}$In$_{0.5}$P clad layer and a p-(Al$_y$Ga$_{1-y}$)$_{0.5}$In$_{0.5}$P clad layer, respectively. In addition, the undoped (Al$_{0.1}$Ga$_{0.9}$)$_{0.5}$In$_{0.5}$P active layer 4 can be expressed as an undoped (Al$_z$Ga$_{1-z}$)$_{0.5}$In$_{0.5}$P active layer. In these general formula of (Al$_y$Ga$_{1-y}$)$_{0.5}$In$_{0.5}$P and (Al$_z$Ga$_{1-z}$)$_{0.5}$In$_{0.5}$P, it is preferred that $0.5 \leq y \leq 1$ and $0 \leq z \leq 0.3$.

Furthermore, if the angle "X" of inclination from the (1 0 0) plane toward the (0 1 1) plane is in the range of $0 \leq X \leq 16$, the semiconductor laser can have a similar performance.

Figure 1:
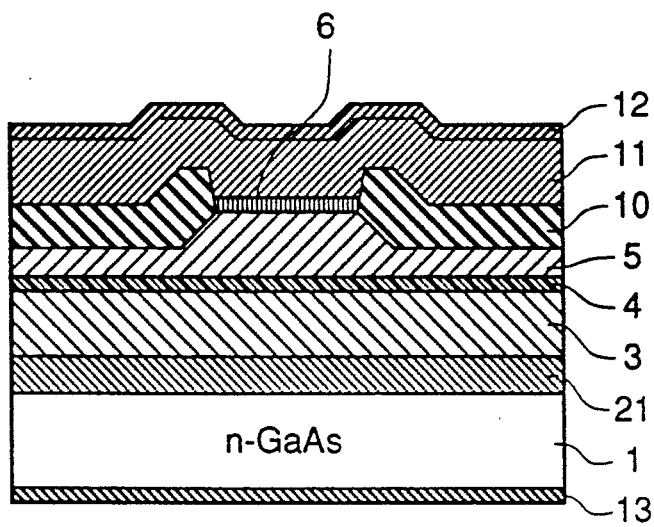
FIG. 1 is a diagrammatic sectional view of a conventional semiconductor laser.
Figure 2:
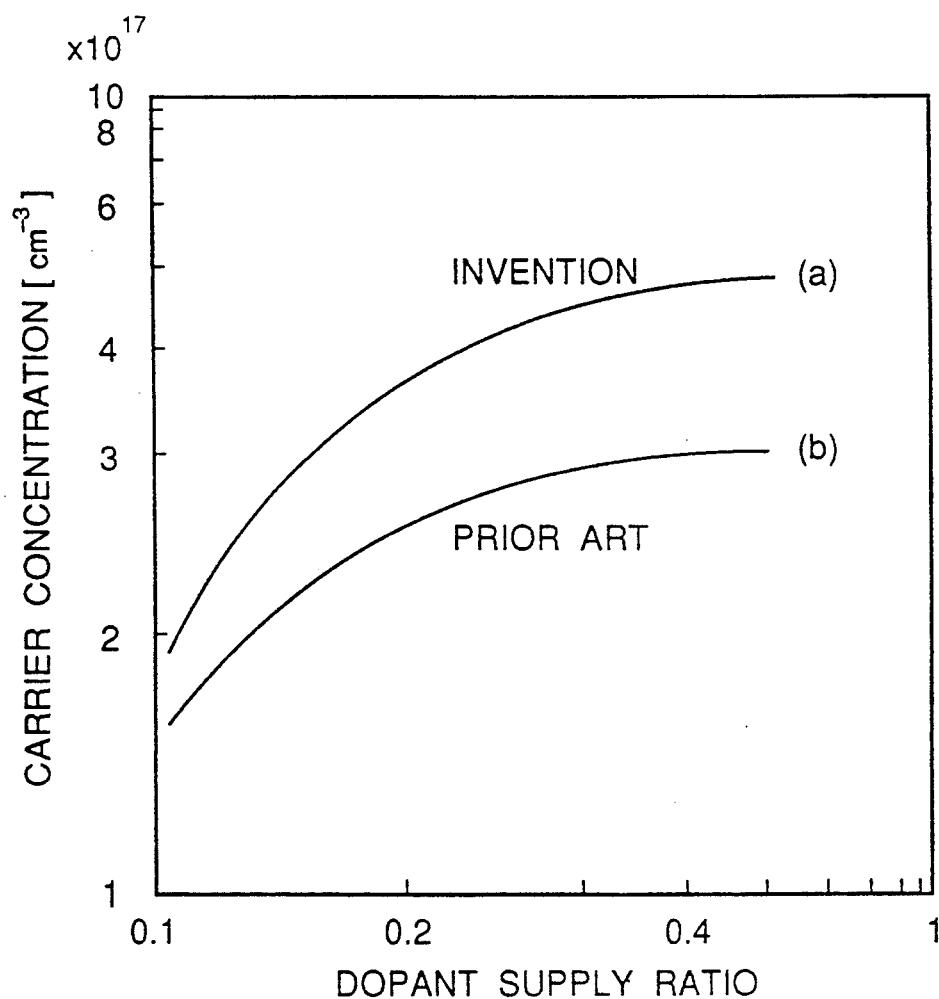
FIG. 2 is a graph illustrating the doping characteristics of the p-type dopant in the semiconductor laser in accordance with the present invention and the conventional semiconductor laser.

In the process in accordance with the present invention as mentioned above, the first crystal growth based on the MO-VPE process is terminated with formation of the n-GaAs layer 7. With this feature, the doping characteristics of the p-type clad layer 5 becomes as the curve line "a" in FIG. 2. This difference between the present invention process and the prior art process is considered to be due to the following reason: When the first crystal growth is terminated with formation of the p-type semiconductor layer layer 6, a gas of AsH$_3$, PH$_3$ and H$_2$ is supplied in the course of a cooling after termination of the crystal growth, and H$_2$ immerses into the crystal so that H$_2$ brings Zn of the p-type dopant into an inactive condition, with the result that the saturation point of the carrier concentration is limited to a low level such as $3 \times 10^{17} cm^{-3}$. On the other hand, when the first crystal growth is terminated with formation of the n-GaAs layer 7, the n-GaAs layer 7 acts as a barrier for immersion of H$_2$, so that the saturation point of the carrier concentration in the p-type clad layer 5 can be elevated to a high level such as $5 \times 10^{17}$cm$^{-3}$.

Thus, the carrier concentration in the p-type clad layer 5 can be effectively increased. The semiconductor laser was manufactured which includes the p-type clad layer 5 having the carrier concentration of $4 \times 10^{17}$cm$^{-3}$. The semiconductor laser had the characteristics of the oscillation threshold current of 50 mA and the oscillation wavelength of 650 nm, which are a remarkable improvement over the prior art semiconductor laser.

The invention has thus been shown and described with reference to the specific embodiments. However, it should be noted that the present invention is in no way limited to the details of the illustrated structures but changes and modifications may be made within the scope of the appended claims.

I claim:

1. A process for manufacturing a semiconductor laser, comprising the steps of sequentially stacking a first conductivity type of (Al$_y$Ga$_{1-y}$)$_{0.5}$In$_{0.5}$P clad layer (0.5<y<1), an undoped (Al$_z$Ga$_{1-z}$)$_{0.5}$In$_{0.5}$P active layer forming a light emission region (0<z<0.3), a second conductivity type of (Al$_y$Ga$_{1-y}$)$_{0.5}$In$_{0.5}$P clad layer (0.5<y<1), a second conductivity type of Ga$_{0.5}$In$_{0.5}$P layer, and a first conductivity type of semiconductor layer, in the named order on an upper surface of a GaAs substrate, said upper surface being inclined at an X degree from a (1 0 0) plane toward a (0 1 1) plane (0<X<16), removing said first conductivity type of semiconductor layer, selectively removing said second conductivity type of Ga$_{0.5}$In$_{0.5}$P layer and said second conductivity type of (Al$_y$Ga$_{1-y}$)$_{0.5}$In$_{0.5}$P clad layer so that a ridge stripe extending in a [0 −1 1] direction is formed of the remaining second conductivity type of Ga$_{0.5}$In$_{0.5}$P layer and the remaining second conductivity type of (Al$_y$Ga$_{1-y}$)$_{0.5}$In$_{0.5}$P clad layer, and the second conductivity type of (Al$_y$Ga$_{1-y}$)$_{0.5}$In$_{0.5}$P clad layer having a reduced thickness remains at both sides of said ridge stripe, forming a current block layer on the second conductivity type of (Al$_y$Ga$_{1-y}$)$_{0.5}$In$_{0.5}$P clad layer at both sides of said ridge stripe, and forming a second conductivity type of GaAs contact layer on said ridge stripe and said current block layer.

2. A process claimed in claim 1 wherein said removal of said first conductivity type of semiconductor layer is performed by an etching liquid.

3. A process claimed in claim 2 wherein the formation of said ridge stripe is performed by forming a stripe pattern mask on said second conductivity type of Ga$_{0.5}$In$_{0.5}$P layer and selectively etching said second conductivity type of Ga$_{0.5}$In$_{0.5}$P layer and said second conductivity type of (Al$_y$Ga$_{1-y}$)$_{0.5}$In$_{0.5}$P clad layer by an etching liquid using said stripe pattern mask as an etching mask.

4. A process claimed in claim 3 wherein the formation of said current block layer is performed by selectively growing said current block layer on said second conductivity type of (Al$_y$Ga$_{1-y}$)$_{0.5}$In$_{0.5}$P clad layer by using said stripe pattern mask as a selective growth mask.

5. A process claimed in claim 4 further including the step of forming a pair of electrodes on said second conductivity type of GaAs contact layer and a bottom surface of said substrate, respectively.

6. A process claimed in claim 1 wherein said sequential stacking of said first conductivity type of (Al$_y$Ga$_{1-y}$)$_{0.5}$In$_{0.5}$P clad layer, said undoped (Al$_z$Ga$_{1-z}$)$_{0.5}$In$_{0.5}$P active layer, said second conductivity type of (Al$_y$Ga$_{1-y}$)$_{0.5}$In$_{0.5}$P clad layer, said second conductivity type of Ga$_{0.5}$In$_{0.5}$P layer, and said first conductivity type of semiconductor layer, is performed by a metal organic vapor phase epitaxy process.

7. A process claimed in claim 1 wherein said first conductivity type of (Al$_y$Ga$_{1-y}$)$_{0.5}$In$_{0.5}$P clad layer, said undoped (Al$_z$Ga$_{1-z}$)$_{0.5}$In$_{0.5}$P active layer, said second conductivity type of (Al$_y$Ga$_{1-y}$)$_{0.5}$In$_{0.5}$P clad layer, said second conductivity type of Ga$_{0.5}$In$_{0.5}$P layer, and said first conductivity type of semiconductor layer, are formed of an Si-doped n-(Al$_{0.6}$Ga$_{0.4}$)$_{0.5}$In$_{0.5}$P clad layer having a thickness of 1µm and a carrier concentration of $5 \times 10^{17}$cm$^{-3}$, an undoped (Al$_{0.1}$Ga$_{0.9}$)$_{0.5}$In$_{0.5}$P active layer having a thickness of 0.06 µm, a Zn-doped p-(Al$_{0.6}$Ga$_{0.4}$)$_{0.5}$In$_{0.5}$P clad layer having a thickness of 1 µm and a carrier concentration of $4 \times 10^{17}$cm$^{-3}$, a Zn-doped p-Ga$_{0.5}$In$_{0.5}$P layer having a thickness of 0.1 µm and a carrier concentration of $1 \times 10^{18}$cm$^{-3}$, and an Si-doped n-GaAs layer having a thickness of 0.2 µm and a carrier concentration of $5 \times 10^{17}$cm$^{-3}$, respectively, all of which are formed by a continuous crystal growth process of a metal organic vapor phase epitaxy process.

8. A process claimed in claim 7 wherein said removal of said Si-doped n-GaAs layer is performed by a phosphoric acid type etching liquid so that said Zn-doped p-Ga$_{0.5}$In$_{0.5}$P layer is exposed.

9. A process claimed in claim 8 wherein the formation of said ridge stripe is performed by forming a stripe pattern mask of an oxide film on said Zn-doped p-Ga$_{0.5}$In$_{0.5}$P layer and selectively etching said Zn-doped p-Ga$_{0.5}$In$_{0.5}$P layer and said Zn-doped p-(Al$_{0.6}$Ga$_{0.4}$)$_{0.5}$In$_{0.5}$P clad layer by a sulfuric acid type etching liquid using said stripe pattern mask as an etching mask.

10. A process claimed in claim 9 wherein the formation of said current block layer is performed by selectively growing said current block layer on said Zn-doped p-(Al$_{0.6}$Ga$_{04}$)$_{0.5}$In$_{0.5}$P clad layer by using said stripe pattern mask as a selective growth mask.

11. A process claimed in claim 10 further including the step of forming a pair of electrodes on said second conductivity type of GaAs contact layer and a bottom surface of said substrate, respectively.

12. A process for manufacturing a semiconductor laser, comprising the steps of sequentially stacking a first clad layer of a compound semiconductor of a first conductivity type, an active layer of an undoped compound semiconductor, a second clad layer of a compound semiconductor of a second conductivity type, a first contact layer of a compound semiconductor of the second conductivity type, and a barrier layer of a compound semiconductor of the first conductivity type, in the named order on an upper surface of a compound semiconductor substrate, removing said barrier layer, selectively removing said first contact layer and said second clad layer so that a ridge stripe is formed of the remaining first contact layer and the remaining second clad layer, and the second clad layer having a reduced thickness remains at both sides of said ridge stripe, forming a current block layer on the second clad layer at both sides of said ridge stripe, forming a second contact layer of a compound semiconductor of the second conductivity type on said ridge stripe and said current block layer, and forming a pair of electrodes on said second contact layer and a bottom surface of said substrate, respectively.

* * * * *

UNITED STATES PATENT AND TRADEMARK OFFICE
CERTIFICATE OF CORRECTION

PATENT NO. : 5,304,507
DATED : April 19, 1994
INVENTOR(S) : Kousei UNOZAWA

It is certified that error appears in the above-identified patent and that said Letters Patent is hereby corrected as shown below:

Abstract, line 11, delete "$Ga_{-y}$" and insert --$Ga_{1-y}$--.
Col. 3, line 37, delete "I" and insert --1--;
Col. 3, line 61, delete "ail" and insert --an--.
Col. 4, line 1, delete "$\mu tm$" and insert --$\mu m$--;
Col. 4, line 61, delete the 2nd occurrence of "layer".

Signed and Sealed this

Twenty-seventh Day of September, 1994

Attest:

BRUCE LEHMAN

Attesting Officer

Commissioner of Patents and Trademarks